United States Patent
Oku et al.

(10) Patent No.: US 11,231,647 B2
(45) Date of Patent: Jan. 25, 2022

(54) PELLICLE AND METHOD FOR MANUFACTURING PELLICLE

(71) Applicant: AIR WATER INC., Sapporo (JP)

(72) Inventors: Hidehiko Oku, Nagano (JP); Ichiro Hide, Nagano (JP)

(73) Assignee: Air Water Inc., Sapporo (JP)

( * ) Notice: Subject to any disclaimer, the term of this patent is extended or adjusted under 35 U.S.C. 154(b) by 162 days.

(21) Appl. No.: 16/637,003

(22) PCT Filed: Aug. 1, 2018

(86) PCT No.: PCT/JP2018/028904
§ 371 (c)(1),
(2) Date: Feb. 6, 2020

(87) PCT Pub. No.: WO2019/031361
PCT Pub. Date: Feb. 14, 2019

(65) Prior Publication Data
US 2020/0166831 A1    May 28, 2020

(30) Foreign Application Priority Data

Aug. 8, 2017  (JP) .............................. JP2017-153569

(51) Int. Cl.
*G03F 1/64* (2012.01)

(52) U.S. Cl.
CPC ..................................... *G03F 1/64* (2013.01)

(58) Field of Classification Search
CPC ........................................................ G03F 1/64
USPC ............................................................. 430/5
See application file for complete search history.

(56) References Cited

U.S. PATENT DOCUMENTS

| | | |
|---|---|---|
| 5,471,946 A | 12/1995 | Scholz et al. |
| 2016/0048079 A1 | 2/2016 | Lee et al. |
| 2016/0334698 A1 | 11/2016 | Jeon et al. |
| 2017/0176850 A1 | 6/2017 | Chen et al. |

FOREIGN PATENT DOCUMENTS

| | | |
|---|---|---|
| JP | 6-216050 A | 8/1994 |
| JP | 9-310170 A | 12/1997 |
| JP | 2002-25916 A | 1/2002 |
| JP | 2017-83691 A | 5/2017 |
| JP | 2018-35014 A | 3/2018 |
| WO | 2014/188710 A1 | 11/2014 |
| WO | 2017/036944 A1 | 3/2017 |
| WO | 2017/141835 A1 | 8/2017 |
| WO | 2017/213264 A1 | 12/2017 |

OTHER PUBLICATIONS

Written Opinion dated Apr. 7, 2021 in Singapore Application No. 11202001133X.
Written Opinion of the International Searching Authority, dated Oct. 16, 2018 in International Application No. PCT/JP2018/028904.
Office Action dated Apr. 28, 2020 in Application No. JP 2017-153569.
International Search Report, dated Oct. 16, 2018 in International Application No. PCT/JP2018/028904.
Supplementary European Search Report dated Jul. 20, 2020 in European Patent Application No. EP 18 84 3684.

*Primary Examiner* — Christopher G Young
(74) *Attorney, Agent, or Firm* — Wood, Phillips, Katz, Clark & Mortimer

(57) ABSTRACT

A pellicle and a method for manufacturing a pellicle that can improve the production yield ratio are provided. A method for manufacturing a pellicle comprises a step to prepare a supporting member containing Si, and a step to form a pellicle film on a top surface of the supporting member. The step to form the pellicle film includes: a step to form a SiC film with a first average carbon concentration on the top surface of the supporting member by carbonizing Si, and a step to form a SiC film with a second average carbon concentration different from the first average carbon concentration on the top surface of the SiC film. The method for manufacturing a pellicle further comprises a step to exposes at least a part of the reverse side of the SiC film by wet etching.

20 Claims, 25 Drawing Sheets

PELLICLE AND METHOD FOR MANUFACTURING PELLICLE

TECHNOLOGICAL FIELD

The present invention relates to a pellicle and a method for manufacturing a pellicle. More specifically, the present invention relates to a pellicle including a SiC film and a method for manufacturing the pellicle.

DESCRIPTION OF THE RELATED ART

According to a photolithography technology used in a semiconductor device manufacturing process, a semiconductor wafer is coated with resist, and exposure light is applied to a required portion of the applied resist using a photo mask, so that a required resist pattern is formed on the semiconductor wafer. When irradiating the resist with exposure light, foreign matter is prevented from adhering to the photo mask by covering the photo mask with a dustproof cover called a pellicle. As a pellicle film for the pellicle, a material having a high transmittance of exposure light and a high resistance to the exposure light (with little deterioration or deformation at high temperatures) is suitable. For this reason, Si (silicon) or the like is used.

According to semiconductor device manufacturing processes, with the miniaturization of semiconductor devices, demands for miniaturization of photolithography technologies are increasing. In recent years, use of the EUV (Extreme Ultra Violet) light (13.5 nanometers) or the like as exposure light has been studied. The EUV light has shorter wavelength than lights in which the light sources are conventional KrF (krypton fluoride) excimer laser (243 nanometers), ArF (argon fluoride) excimer laser (193 nanometers), or the like.

Light energy increases inversely with the length of wavelength. For this reason, the shorter the wavelength of the exposure light, the greater the energy that a pellicle film receives from the exposure light. Then, with the shortening of the exposure light wavelength, pellicle films are required to have higher resistance to exposure lights. As a material for such pellicle films, it has been proposed to use SiC (silicon carbide), which is more thermally and chemically stable than Si.

Technologies relating to methods for manufacturing pellicle films composed of SiC are disclosed in, for example, Patent Prior Documents 1 to 3 below.

Patent Document 1 listed below discloses a technique for manufacturing a pellicle film made of SiC using a mesh-like silicon wafer as a support material. With this technology, a poly-crystal SiC film is formed on a silicon wafer by the LPCVD method. The poly-crystal SiC film is polished to the thickness of 150 nanometers by the CMP method. By wet etching of the silicon wafer using KOH (potassium hydroxide) aqueous solution, a pellicle film is created.

Patent Document 2 below discloses a method for manufacturing a pellicle film. A pellicle film with a thickness of 10 nanometers or more and 100 nanometers or less is formed on a substrate. The surface of the substrate opposite to the surface on which the pellicle film was formed is etched, and a part of the substrate is removed, so that the pellicle film is exposed. As materials of the pellicle film, SiC and so on are listed. A silicon substrate is mentioned as the substrate.

Patent Document 3 below discloses the following technology. The entire surface of a Si substrate is carbonized. Subsequently, a SiC film having a thickness of about 1 micrometer is formed on the entire surface of the Si substrate by using the LPCVD method. A SiC film on one of surfaces of the Si substrate is removed in an arbitrary area. The Si substrate exposed in the window section of the SiC film is dissolved and removed. A structure in which the SiC film is self-supported in the window section of the SiC film is manufactured.

PRIOR ART DOCUMENT

Document(s) Related to Patents

[Prior Art Document 1] International Publication No. 2014/188710 pamphlet

[Prior Art Document 2] Japanese Patent Laid-Open No. 2017-83791

[Prior Art Document 3] Japanese Patent Laid-Open No. (HEI) 9-310170

SUMMARY OF THE INVENTION

Problems to be Solved by the Invention

There is a demand for pellicle films consisting of SiC to have a large area to cover a large area photo mask, and to thin films to achieve high transmittance. However, when trying to increase an area of a SiC film or thin the film (for example, when trying to make it 100 nanometers or less in thickness), the mechanical strength of the SiC film will be low. Hence, phenomena in which a SiC film contains cracks, or a SiC film peels off from the Si substrate may occur. The production yield ratio was significantly lower.

The present invention has been made to solve the above problems. The object of the present invention is to provide a pellicle and a method for manufacturing a pellicle which can improve the production yield ratio.

Ways to Solve the Problems

According to one aspect of the invention, a pellicle comprises: a supporting member with a ring-like and planar shape and containing Si, and a pellicle film formed on one principal surface of the supporting member, wherein the pellicle film includes a SiC film having a thickness of 10 nanometers or more and 100 nanometers or less, and the SiC film includes a first SiC film formed on the one principal surface of the supporting member and having a first average carbon concentration, and a second SiC film formed on one principal surface of the first SiC film and having a second average carbon concentration different from the first average carbon concentration.

Preferably, according to the pellicle, a SiC film is not formed on another principal surface of the supporting member.

Preferably, according to the pellicle, a Si oxide film is not formed on a principal surface opposite to a side on which the supporting member is formed on the SiC film.

Preferably, according to the pellicle, the pellicle film further includes a radiation film formed on one principal surface of the second SiC film, and the radiation film has a higher radiation factor than radiation factors of the first and second SiC film.

Preferably, according to the pellicle, the radiation film contains Ru.

Preferably, according to the pellicle, a thickness of the first SiC film is greater than 0 and less than or equal to 10 nanometers and the first average carbon concentration is lower than the second average carbon concentration.

Preferably, according to the pellicle, a transmittance rate of the pellicle film for light having wavelength of 13.5 nanometers is 70% or more.

Preferably, according to the pellicle, the supporting member is composed of a Si substrate.

Preferably, according to the pellicle, the supporting member includes a Si substrate and a Si oxide film formed on one principal surface of the Si substrate.

According to one aspect of the invention, a method for manufacturing a pellicle comprises: a step to prepare a supporting member containing Si, and a step to form a pellicle film on one principal surface of the supporting member, wherein the step to form the pellicle film includes a step to form a first SiC film having a first average carbon concentration on one principal surface of the supporting member, by carbonizing Si of the one principal surface of the supporting member, and a step to form a second SiC film having a second average carbon concentration different from the first average carbon concentration on one principal surface of the first SiC film, wherein the method further comprises a step to exposes at least a part of another principal surface of the first SiC film by wet etching.

Preferably, according to the method for manufacturing a pellicle, the step to form the pellicle film includes a step to form a radiation film having a radiation factor higher than radiation factors of the first and second SiC films on one principal surface of the second SiC film.

Preferably, according to the method for manufacturing a pellicle, the step to expose at least a part of another principal surface of the first SiC film is performed after the step to form the radiation film.

Preferably, according to the method for manufacturing a pellicle, at least the supporting member and the first SiC film are moved relative to liquid chemical used for the wet etching, in the step to expose at least a part of another principal surface of the first SiC film.

Preferably, according to the method for manufacturing a pellicle, at least the supporting member and the first SiC film are moved in a direction in a plane parallel to the another principal surface of the first SiC film, in the step to expose at least a part of another principal surface of the first SiC film.

Preferably, according to the method for manufacturing a pellicle, at least with the supporting member and the first SiC film rotated, liquid chemical used for the wet etching is injected onto another principal surface of the supporting member, in the step to expose at least a part of another principal surface of the first SiC film.

Preferably, according to the method for manufacturing a pellicle, the method further comprises a step to form a recessed part having Si as a bottom surface on a central part of another principal surface of the supporting member, wherein the first SiC film is exposed on the bottom surface of the recessed part, in the step to expose at least a part of another principal surface of the first SiC film.

Preferably, according to the method for manufacturing a pellicle, the central part of the another principal surface of the supporting member is removed by wet etching, with a mask layer consisting of an oxide film or a nitride film formed on the another principal surface of the supporting member as a mask, in the step to form a recessed part on the central part of the another principal surface of the supporting member.

Preferably, according to the method for manufacturing a pellicle, mixed acid including hydrofluoric acid and nitric acid is used as liquid chemical used for the wet etching, in the step to expose at least a part of another principal surface of the first SiC film.

Preferably, according to the method for manufacturing a pellicle, a Si substrate is prepared as the supporting member, in the step to prepare a supporting member.

Preferably, according to the method for manufacturing a pellicle, a Si substrate, a Si oxide film formed on one principal surface of the Si substrate, and a Si film formed on one principal surface of the Si oxide film are prepared in the step to prepare the supporting member, and at least a part of the Si film is carbonized, in the step to form the first SiC film.

Effect of the Invention

According to the present invention, it is possible to provide a pellicle and a method for manufacturing a pellicle that can improve the production yield ratio.

DETAILED DESCRIPTION OF EMBODIMENTS

Hereinafter, embodiments of the present invention will be described with reference to the drawings.

First Embodiment

Figure 1:
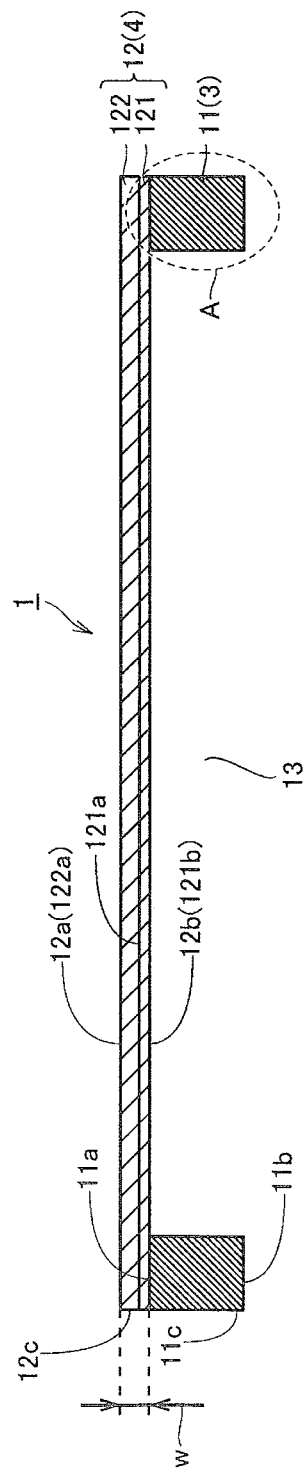
FIG. 1 is a cross-sectional view showing the configuration of pellicle the first embodiment of the present invention.

FIG. 1 is a cross-sectional view showing the configuration of pellicle 1 in the first embodiment of the present invention. FIG. 1 shows a cross-sectional view when the SiC film 12 is cut on a plane perpendicular to the top surface 12a.

Referring to FIG. 1, pellicle 1 has supporting member 3 including Si and pellicle film 4 including SiC film 12. According to the present embodiment, supporting member 3 is composed of Si substrate 11. Pellicle film 4 is composed of SiC film 12.

Si substrate 11 has a ring-like and planar shape. Si substrate 11 includes top surface 11a, reverse side 11b, and side surface 11c. The (111) plane is exposed on top surface 11a of Si substrate 11. The (100) plane or (110) plane may be exposed on top surface 11a of Si substrate 11.

SiC film 12 is formed on top surface 11a of Si substrate 11. SiC film 12 includes SiC film 121 (an example of a first SiC film) and SiC film 122 (an example of a second SiC film). SiC film 121 is formed on top surface 11a of Si substrate 11 and has a first average carbon concentration. SiC film 122 is formed on surface 121a of SiC film 121 and has a second average carbon concentration different from the first average carbon concentration.

SiC film 12 includes top surface 12a, reverse side 12b, and side surface 12c. Top surface 12a of SiC film 12 corresponds to top surface 122a of SiC film 122. Reverse side 12b of SiC film 12 corresponds to reverse side 121b of SiC film 121. The reverse side 12b of the SiC film 12 is exposed to the recessed part 13 inside the ring-like Si substrate 11, SiC film 12 is not formed on reverse side 11b of Si substrate 11, and reverse side 11b of Si substrate 11 is exposed.

SiC film 12 has a thickness w of 10 nanometers or more and 100 nanometers or less. SiC film 12 is composed of single-crystal 3C-SiC, poly-crystal 3C-SiC, amorphous SiC, or the like. In particular, if SiC film 12 is epitaxially grown on Si substrate 11 surface, generally, SiC film 12 consists of 3C-SiC.

It is preferable that the transmittance of pellicle film 4 of pellicle 1 for light having wavelength of 13.5 nanometers is 70% or more.

A SiC film is not formed on reverse side 11b of Si substrate 11. In addition, a Si oxide film is not formed on top surface 12a (a principal surface opposite to the side where Si substrate 11 is formed) of SiC film 12, and pellicle film 1 does not include a Si oxide film.

Figure 2:
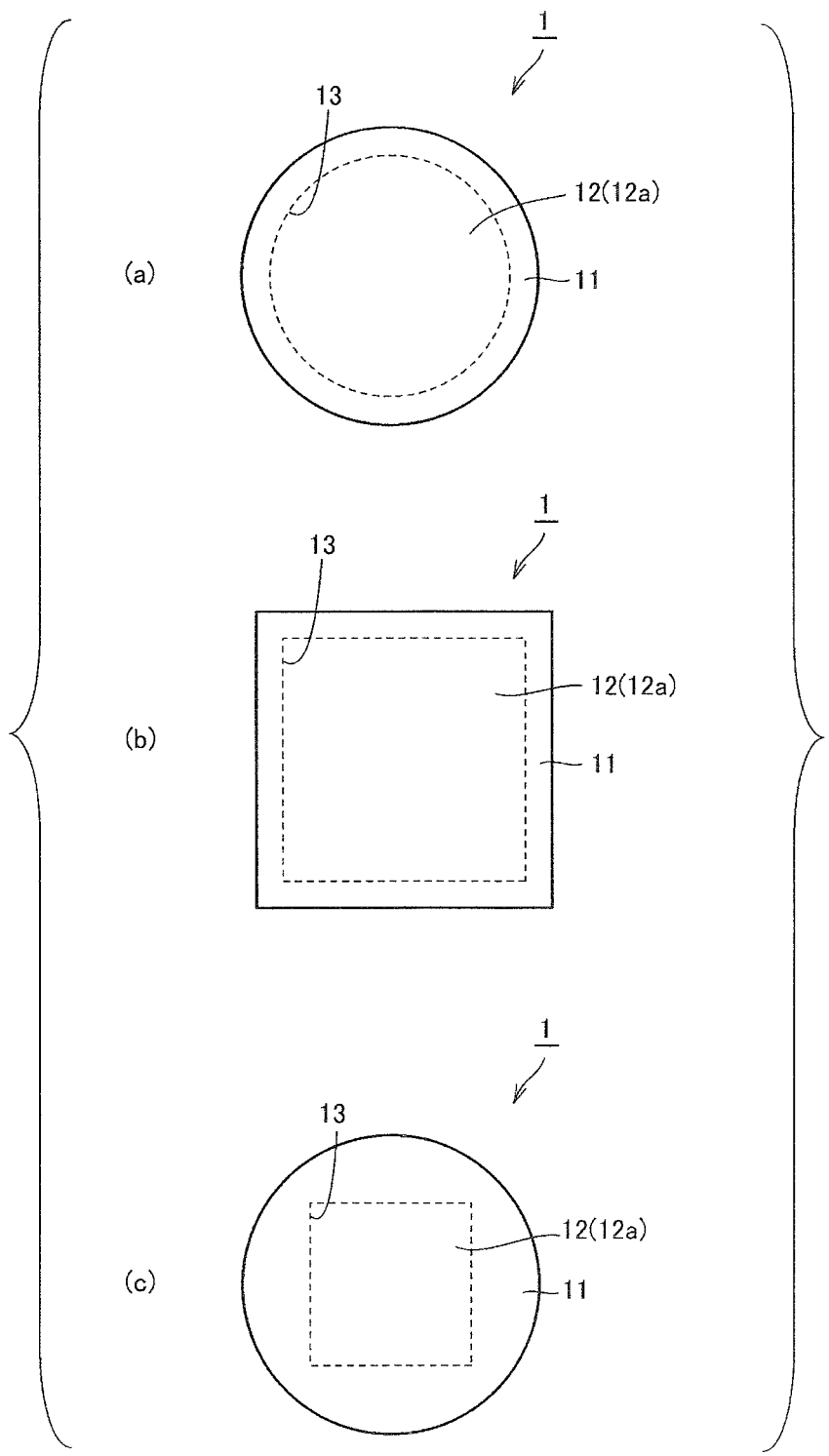
FIG. 2 is a plan view indicating the configuration of pellicle 1, when viewed from the direction perpendicular to top surface 12a of SiC film 12, in the first embodiment of the present invention.

FIG. 2 is a plan view indicating the configuration of pellicle 1 when viewed from the direction perpendicular to top surface 12a of SiC film 12 in the first embodiment of the present invention. In FIG. 2, for the purpose of showing the shape of Si substrate 11, Si substrate 11 is shown by a dotted line. In fact, Si substrate 11 is not directly visible.

Referring to FIG. 2, each of Si substrate 11, SiC film 12, and recessed part 13 has an arbitrary planar shape. The SiC film 12 has its outer peripheral end supported by ring-like Si substrate 11. Thus, the mechanical strength of SiC film 12 is reinforced by Si substrate 11. Each of Si substrate 11, SiC film 12, and recessed part 13, for example as shown in FIG. 2(a), may have the planar shape of a circle. As shown in FIG. 2(b), it may have a rectangular planar shape. In FIG. 2(b), Si substrate 11 has a square ring-like planar shape. Further, as shown in FIG. 2(c), each of Si substrate 11 and SiC film 12 may have a circular planar shape, and recessed part 13 may have a rectangular planar shape. The size of recessed part 13 is arbitrary and may be determined according to the mechanical strength required for pellicle 1 or the like.

Next, the method for manufacturing pellicle 1 according to the present embodiment will be described with reference to FIGS. 3 to 11.

Figure 3:
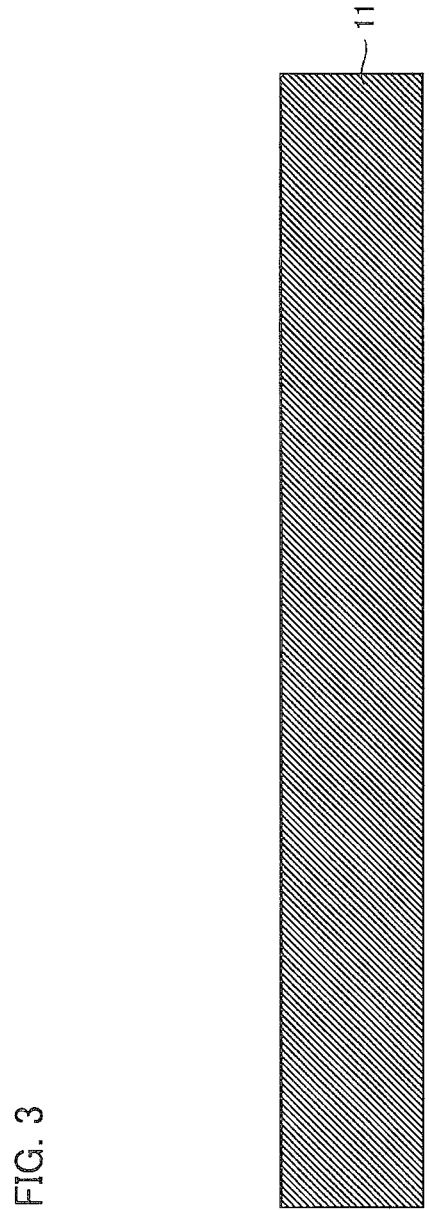
FIG. 3 is a cross-sectional view indicating the first step of the method for manufacturing of pellicle 1, in the first embodiment of the present invention.

Referring to FIG. 3, for example, Si substrate 11 of disc-shaped (recessed part 13 is not formed) is prepared.

Figure 4:
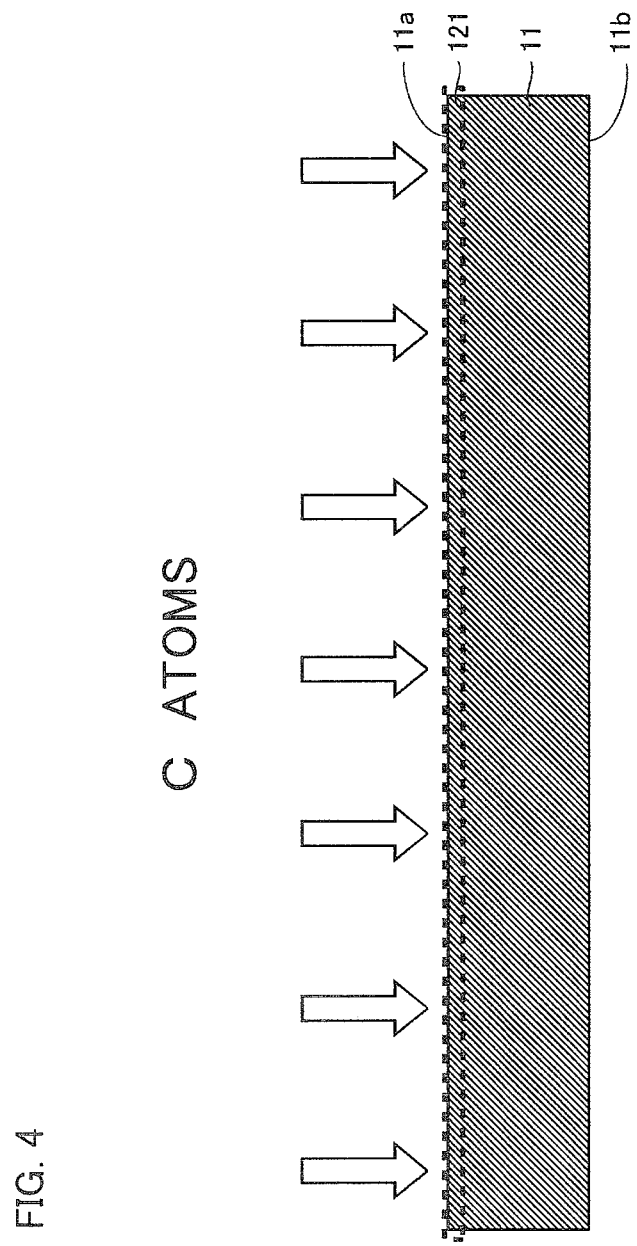
FIG. 4 is a cross-sectional view indicating the second step of the method for manufacturing of pellicle 1 in the first embodiment of the present invention.

Referring to FIG. 4, next, by carbonizing (carbonizing) top surface 11a of Si substrate 11 in hydrocarbon type gas atmosphere, SiC film 121 is formed at top surface 11a. The part which was top surface 11a of Si substrate 11 before the carbonizing is changed to SiC film 121 by the carbonizing. The surface 11a of Si substrate 11 retreats toward reverse side 11b side by the carbonizing. The temperature in the atmosphere is preferably 900 degrees Celsius to 1405 degrees Celsius. The hydrocarbon type gas is propane gas, and it is preferable to use hydrogen gas as a carrier gas. The flow rate of the propane gas is, for example, 10 sccm, and the flow rate of hydrogen gas is, for example, 1000 sccm.

Figure 5:
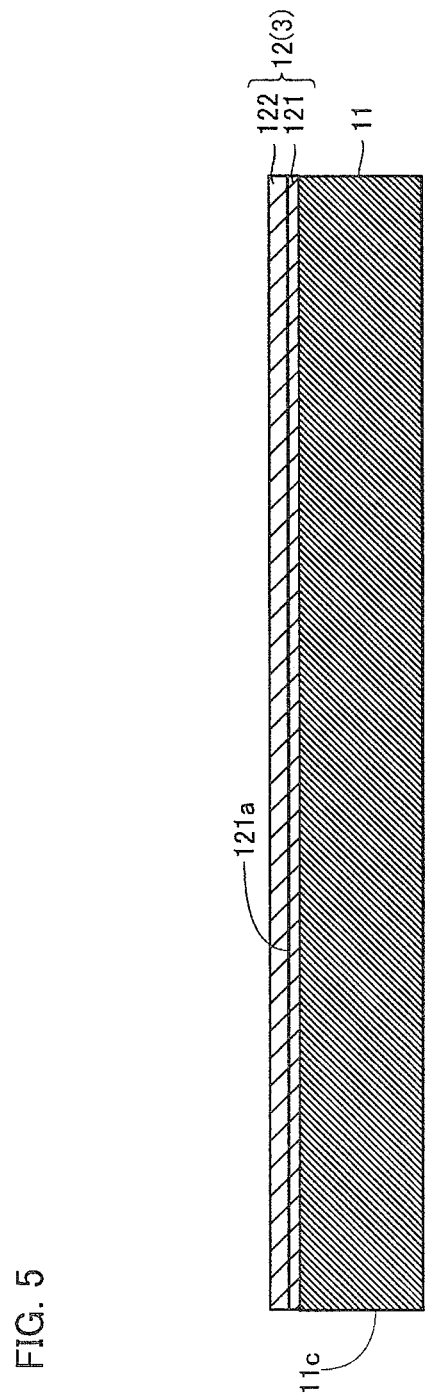
FIG. 5 is a cross-sectional view indicating the third step of the method for manufacturing of pellicle 1 in the first embodiment of the present invention.

Referring to FIG. 5, subsequently, SiC film 122 is epitaxially grown on top surface 121a of SiC film 121. Thus, SiC film 12 is formed on top surface 11a of Si substrate 11. SiC film 122 is formed using the MBE (Molecular Beam Epitaxy) method, the CVD (Chemical Vapor Deposition) method, or the like. In the case of the forming of SiC film 122, SiC film 122 may also be formed on side surface 11e of Si substrate 11.

The epitaxial growth of SiC film 122 is performed, for example, as follows. The substrate with SiC film 121 formed is heated to a temperature of 900 degrees Celsius or more and 1405 degrees Celsius or less, while supplying source gas consisting of methyl silane-based gas at a flow rate of about 1.0 sccm.

Figure 6:
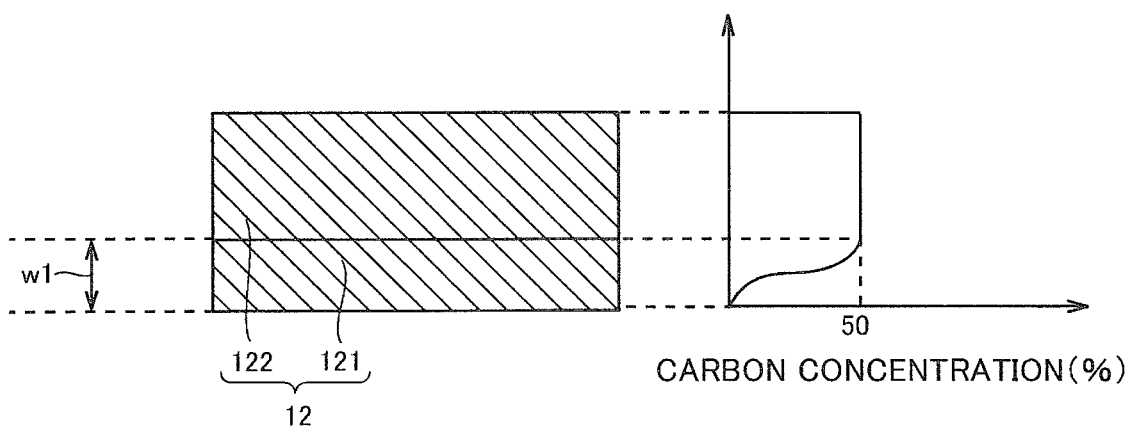
FIG. 6 is a diagram schematically showing a carbon concentration distribution in SiC film 12, according to the first embodiment of the present invention.

FIG. 6 is a diagram schematically showing the carbon concentration distribution in SiC film 12, according to the first embodiment of the present invention.

Referring to FIG. 6, when forming SiC film 122, SiC film 122 is formed on a certain film forming condition. For this reason, Si atoms and C atoms exist at almost the same ratio in SiC film 122. On the other hand, when SiC film 121 is formed by carbonizing of Si substrate 11, the C atoms penetrate into Si substrate 11 through top surface 11a of Si substrate 11. As a result, in SiC film 121, as the distance from the boundary face with SiC film 122 increases, the carbon concentration decreases. Also, when SiC film 121 is formed by carbonizing of Si substrate 11, C atoms are less likely to enter into the film than SiC film 122 forming. For this reason, typically, the thickness w1 of SiC film 121 is greater than 0 and less than or equal to 10 nanometers. The average carbon concentration of SiC film 121 is lower than the average carbon concentration of SiC film 122.

The carbon concentration distribution and the average carbon concentration in SiC films 121 and 122 are arbitrary. The average carbon concentration of SiC film 121 and the average carbon concentration of SiC film 122 need only be different from each other.

Figure 7:
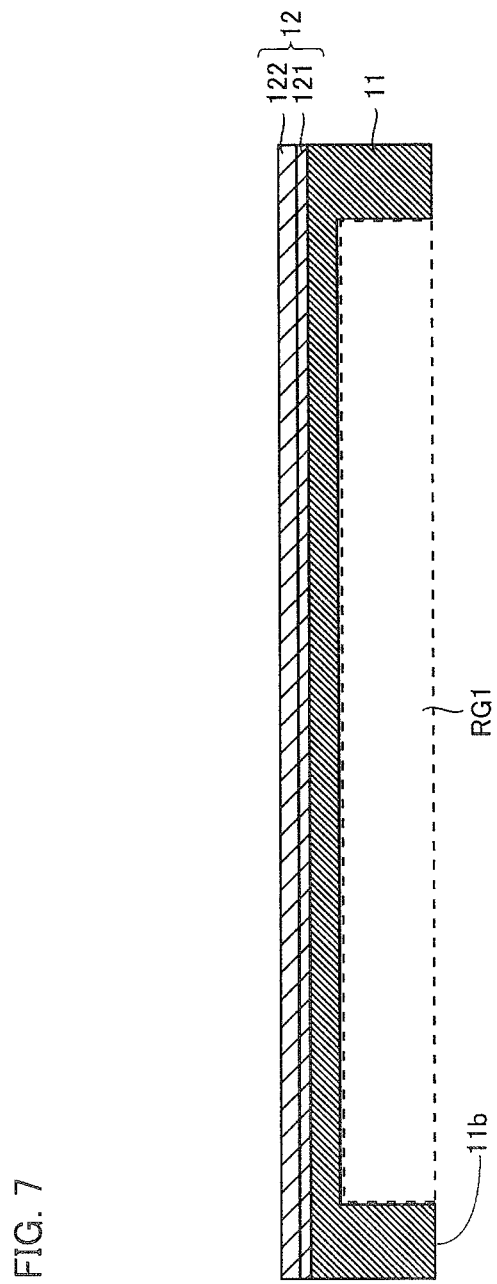
FIG. 7 is a cross-sectional view indicating the fourth step of the method for manufacturing of pellicle 1 in the first embodiment of the present invention.

Referring to FIG. 7, next, Si of central part RG1 of reverse side 11b of Si substrate 11 is removed (reverse side 11b of Si substrate 11 is counterbored). The removal of the Si of central part RG1 may be performed by mechanically grinding the Si of central part RG1 of Si substrate 11. Further, the removal of Si of central part RG1 may be performed as follows. Photoresist is formed in the area except for central part RG1 on reverse side 11b of Si substrate 11. Etching of Si of central part RG1 is performed with the photoresist formed as a mask.

In order to increase the resistance of the mask to liquid chemical used for wet etching of Si, the removal of Si of central part RG1 may be performed by the following method.

Figure 8:
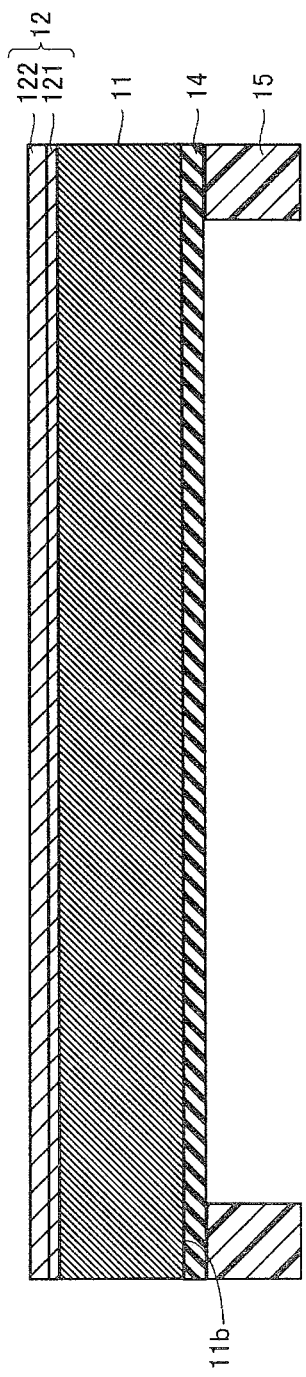
FIG. 8 is a cross-sectional view indicating the first step of a modification of the step shown in FIG. 7.

Referring to FIG. 8, mask layer 14 made of a Si oxide film or a Si nitride film is formed on the entire surface of reverse side 11b of Si substrate 11. Subsequently, on the mask layer 14, photoresist 15 which is patterned into a required shape is formed.

Figure 9:
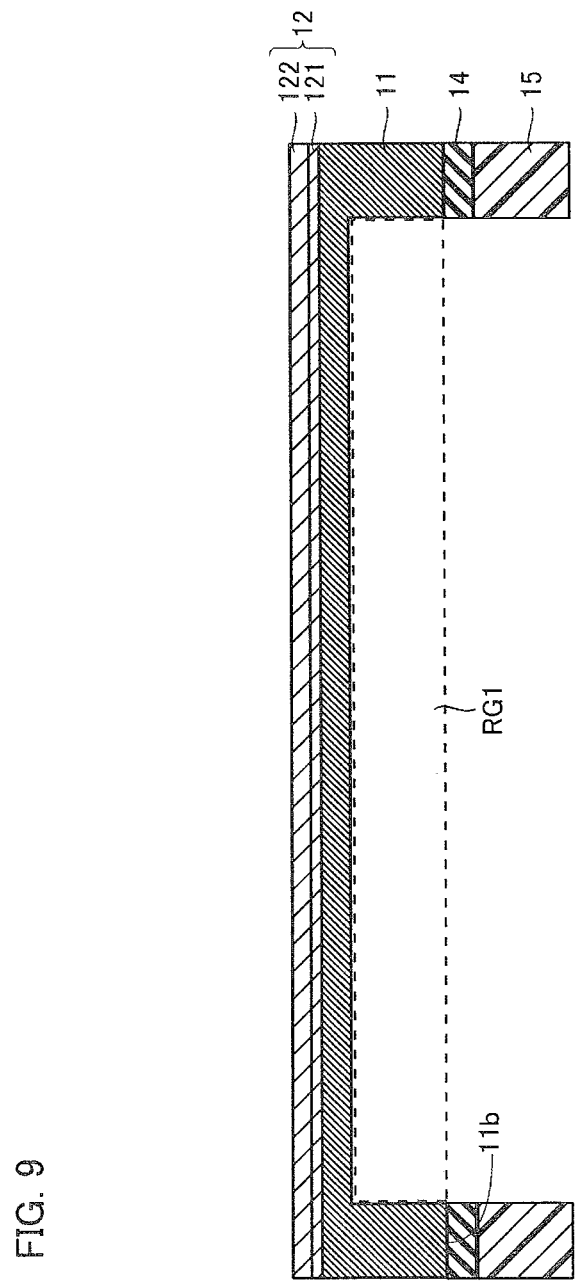
FIG. 9 is a cross-sectional view indicating the second step of a modification of the step shown in FIG. 7.

Referring to FIG. 9 next, mask layer 14 is patterned by wet etching using photoresist 15 as a mask. Thus, only a peripheral part of mask layer 14 is left. If mask layer 14 consists of a Si oxide film, a hydrofluoric acid solution or the like is used as liquid chemical of the wet etching of mask layer 14. If mask layer 14 is made of a Si nitride film, a phosphoric acid solution or the like is used as liquid chemical of the wet etching of mask layer 14. Then, Si of central part RG1 is removed by wet etching, using liquid chemical such as mixed acid, with mask layer 14 patterned as a mask. After that, photoresist 15 and mask layer 14 are removed. Note that photoresist 15 may be removed before wet etching of Si.

By preparing a substrate on which mask layer 14 was formed in advance on reverse side 11b of Si substrate 11 at the step shown in FIG. 3, the step in which mask layer 14 is formed shown in FIG. 8 may be omitted. Also, as mask layer 14, an oxide film or a nitride film other than a Si oxide film may be used.

Figure 10:
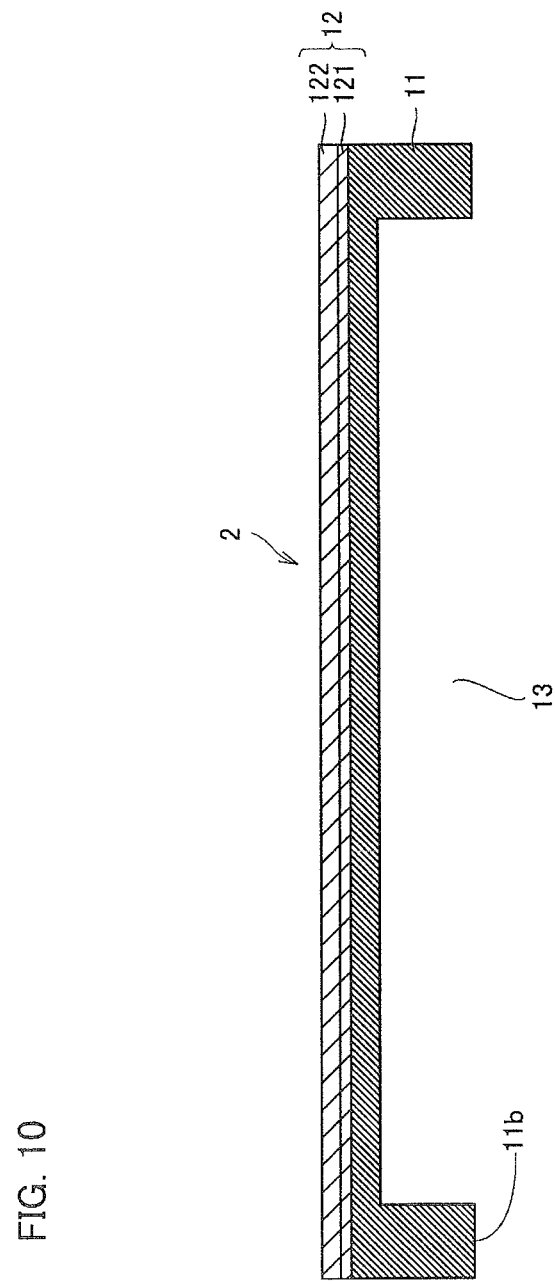
FIG. 10 is a cross-sectional view showing a state immediately after the fourth step of the method for manufacturing of pellicle 1 in the first embodiment of the present invention.

Referring to FIG. 10, as a result of removal of Si of central part RG1, recessed part 13 is formed on reverse side 11b of Si substrate 11. In FIG. 10, the recessed part 13 has a depth that does not penetrate the Si substrate 11, and the bottom surface of the recessed part 13 is made of Si. With the presence of recessed part 13, the thickness (length in the vertical direction in FIG. 10) of the central part of Si substrate 11 is smaller than the thickness of the peripheral part of Si substrate 11.

Figure 11:
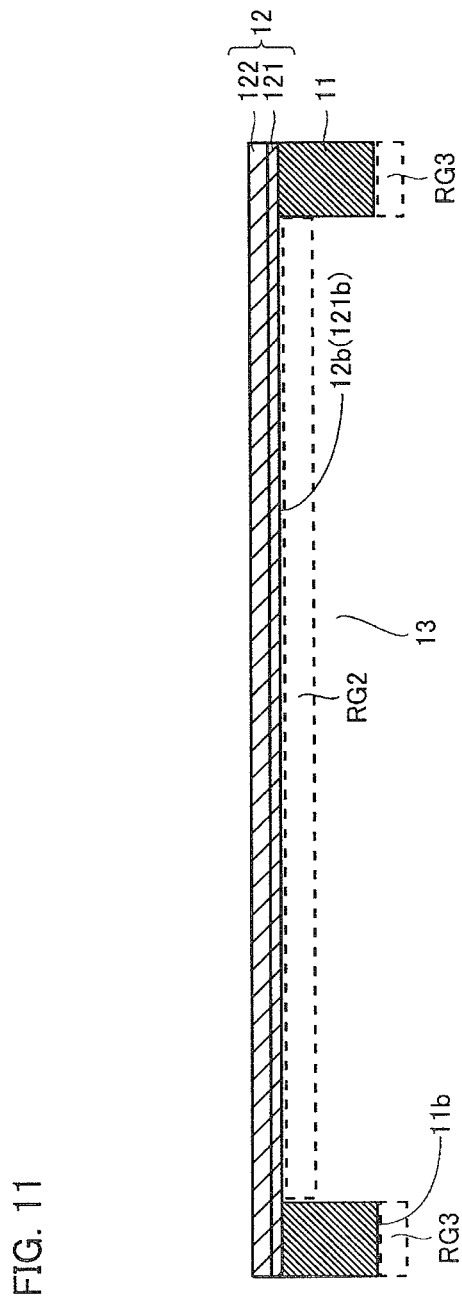
FIG. 11 is a cross-sectional view indicating the fifth step of the method for manufacturing of pellicle 1 in the first embodiment of the present invention.

Referring to FIG. 11, subsequently, the bottom surface RG2 of the recessed part 13 of the Si substrate 11 is removed by wet etching. The bottom surface RG2 formed a part of reverse side 11b of the Si substrate. As a result of the removal of Si in the bottom surface RG2, reverse side 12b of the SiC film 12 (reverse side 121b of the SiC film 121) is exposed on the bottom surface of the recessed part 13. Also, during this wet etching, Si of peripheral part RG3 of reverse side 11b of Si substrate 11 is removed together with the Si of bottom surface RG2. By adopting wet etching, damage to SiC film 12 when removing the Si substrate can be prevented. With the above steps, pellicle 1 shown in FIG. 1 is completed.

The wet etching of Si in the bottom surface RG2 is preferably performed by moving Si substrate 11 and SiC film 12 relatively to liquid chemical used for wet etching. Moving methods for Si substrate 11 and SiC film 12 includes: rotating Si substrate 11 and SiC film 12 without changing the position of Si substrate 11 and SiC film 12, changing the position of Si substrate 11 and SiC film 12 (in other words, moving Si substrate 11 and SiC film 12), rotating Si substrate 11 and SiC film 12 while changing the position of Si substrate 11 and SiC film 12, and so on. As liquid chemical used for wet etching of Si, for example, mixed acid including hydrofluoric acid and nitric acid, potassium hydroxide (KOH) aqueous solution or the like are used.

When using an alkaline solution such as potassium hydroxide aqueous solution or the like as liquid chemical for wet etching of Si, even the SiC film 12 may be etched through pinholes present at a low density in SiC film 12. In order to prevent SiC film 12 from being etched, and to improve the quality of SiC film 12, it is preferable to use the above-mentioned mixed acid as liquid chemical for wet etching of Si.

The direction in which Si substrate 11 and SiC film 12 are moved during wet etching of Si is arbitrary. However, to prevent the SiC film 12 from being damaged by the pressure from liquid chemical while moving Si substrate 11 and SiC film 12, it is preferable that Si substrate 11 and SiC film 12 are moved in a direction in a plane (plane PL in FIGS. 12 to 14) parallel to reverse side 12b of SiC film 12 (reverse side 121b of SiC film 121) as like the first to third methods mentioned below.

Figure 12:
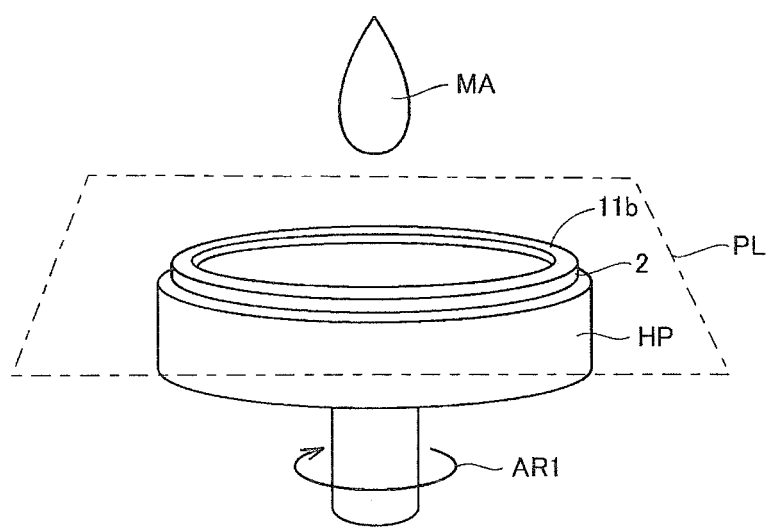
FIG. 12 is a view schematically showing a first method of wet etching of Si according to the first embodiment of the present invention.
Figure 13:
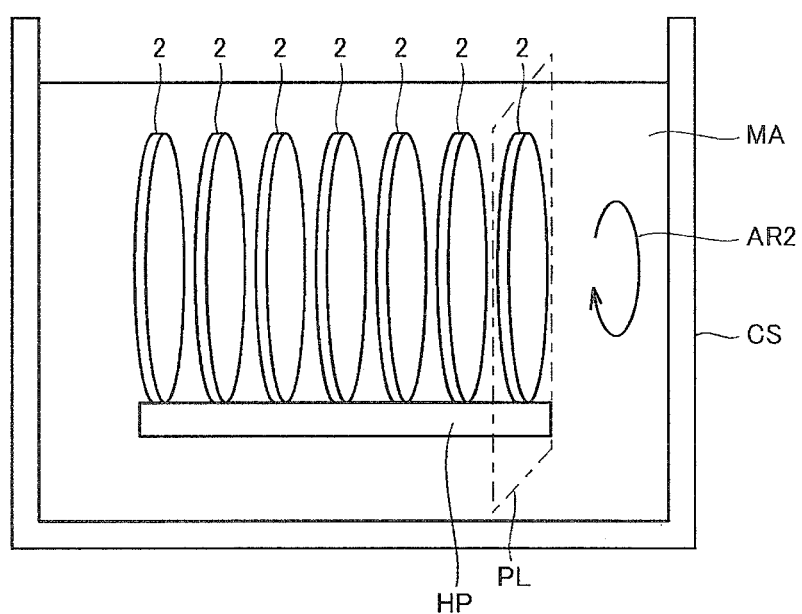
FIG. 13 is a view schematically showing a second method of wet etching of Si according to the first embodiment of the present invention.
Figure 14:
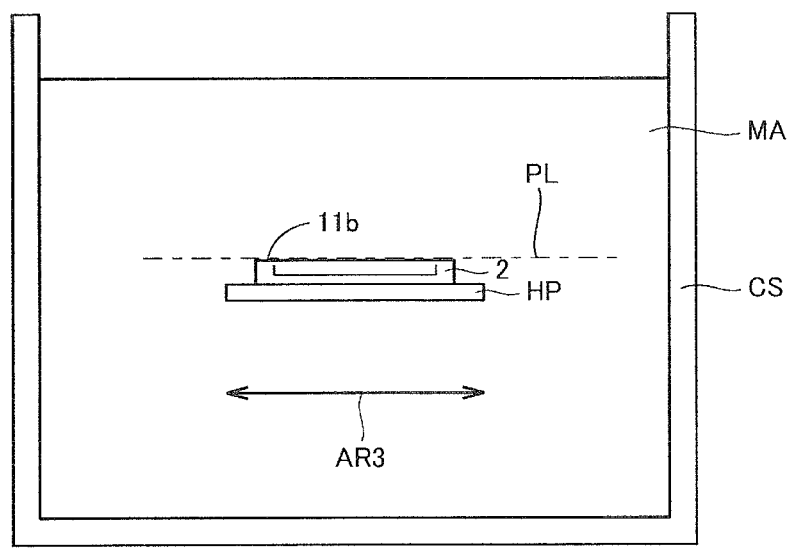
FIG. 14 is a view schematically showing a third method of wet etching of Si according to the first embodiment of the present invention.

FIG. 12 to FIG. 14 are diagrams schematically showing first to third methods of wet etching of Si according to the first embodiment of the present invention. In the description for FIGS. 12 to 14, the structure immediately before the wet etching of Si is described as intermediary body 2. In the present embodiment, the structure immediately after step in FIG. 10 corresponds to intermediary body 2.

Referring to FIG. 12, the first method is to remove Si by spin etching. In the first method, intermediary body 2 is fixed to holding platform HP so that reverse side 11b of Si substrate 11 faces up. And, as shown by the arrow AR1, holding platform HP is rotated about a rotation axis extending in a direction orthogonal to reverse side 11b. In this way, with intermediary body 2 being rotated without changing the position of intermediary body 2, liquid chemical MA (etchant) used for wet etching is injected onto reverse side 11b of Si substrate 11. The rotation speed of the holding platform HP is set to, for example, about 100 to 1500 rpm.

Referring to FIG. 13, in the second method, a plurality of intermediary bodies 2 are fixed to holding platform HP in an upright state. Then, a plurality of intermediary bodies 2 are immersed in liquid chemical MA filled in reaction vessel CS. Intermediary bodies 2 and holding platform HP are rotated while changing the position of intermediary bodis 2, as shown by arrow AR2, in plane PL parallel to reverse side 12b of SiC film 12.

Referring to FIG. 14, in the third method, intermediary body 2 is fixed to holding platform HP so that reverse side 11b of Si substrate 11 faces up. And intermediary body 2 is immersed in liquid chemical MA filled inside reaction vessel CS. In the plane PL parallel to the reverse side 12b of SiC film 12, as shown by arrow AR3, intermediary body 2 and holding platform HP are reciprocated on a straight line.

Figure 15:
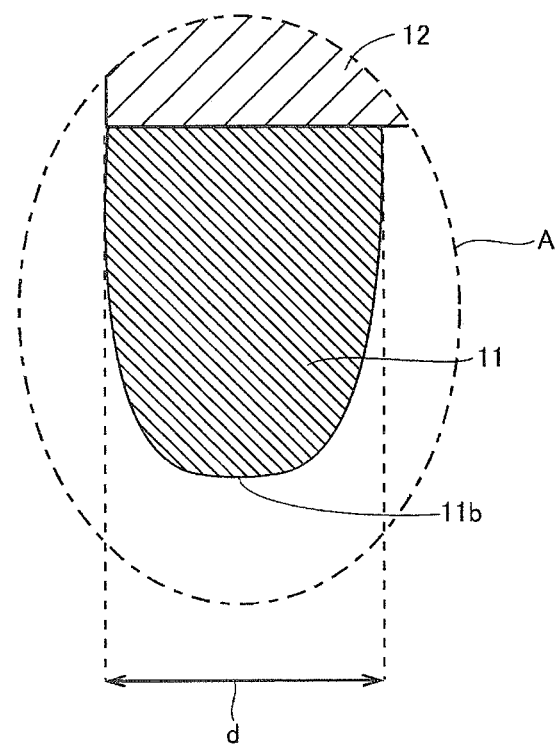
FIG. 15 is an enlarged view of the portion A of pellicle 1 shown in FIG. 1.

FIG. 15 is an enlarged view of part A of pellicle 1 shown in FIG. 1. In FIG. 15, the change in width of Si substrate 11 is more emphasized than the actual one.

Referring to FIG. 15, mixed acid including hydrofluoric acid and nitric acid has the effect of isotopically etching Si. For this reason, when Si is wet-etched using mixed acid including hydrofluoric acid and nitric acid as liquid chemical, as the distance from the SiC film 12 increases (from the SiC film 12 to the reverse side 11b of the Si substrate 11), the width d (the horizontal length in FIG. 15) of the Si substrate 11 decreases, as its traces.

Figure 16:
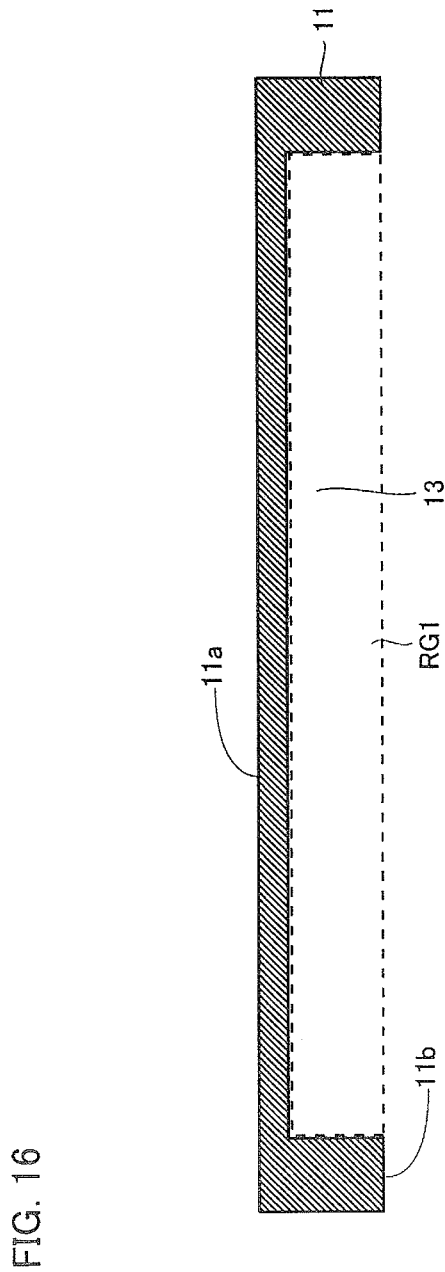
FIG. 16 is a cross-sectional view indicating a modification of the method for manufacturing of pellicle 1 in the first embodiment of the present invention.

In the modification of the method for manufacturing in this embodiment, as shown in FIG. 16, the structure shown in FIG. 10 may be manufactured by forming SiC film 12 on top surface 11a of Si substrate 11 after forming recessed part 13 by removing Si of central part RG1 of reverse side 11b of Si substrate 11.

According to the present embodiment, since adhesion between SiC film 121 obtained by carbonizing of top surface 11a of Si substrate 11 and SiC film 122 obtained by film forming is good, the overall mechanical strength of SiC film 12 can be improved. Thus, it is possible to prevent the mechanical strength of SiC film 12 from being reduced when SiC film 12 is made larger and thinned, so that the production yield ratio can be improved.

In addition, according to the present embodiment, during the wet etching of Si substrate 11, by moving Si substrate 11 and SiC film 12 relative to liquid chemical in wet etching, it is possible to prevent cracks from entering to SiC film 12 and to prevent SiC film 12 from peeling off from Si substrate 11 during wet etching of Si substrate 11. Thus, film thinning of SiC film 12 in pellicle 1 can be achieved.

The inventors of the present application had found the following points. The reason in which cracks enter into SiC film 12 or SiC film 12 is peeled off from Si substrate 11 during wet etching of Si substrate 11 (dipping Si substrate 11 in liquid chemical) is as follows. Liquid chemical after reacting locally stays on the reaction surface of Si substrate 11 (the surface of the part which reacts with liquid chemical on reverse side 11b of Si substrate 11). As a result, the etching rate of Si becomes uneven, so that the reaction surface of Si substrate 11 becomes rough. The inventors of the present application had found the followings. When mixed acid is used as liquid chemical for wet etching, large bubbles generated by the reaction between liquid chemical and Si stay locally on the reaction surface of Si substrate 11. The bubbles locally prevent the reaction of the reaction surface of Si substrate 11 with liquid chemical, and make the reaction surface of Si substrate 11 rough.

If the SiC film 12 is relatively thick (e.g., if the thickness is greater than 100 nanometers), the mechanical strength of the SiC film 12 itself is high. For this reason, the roughness of the reaction surface of Si substrate 11 does not have much negative impact on the SiC film 12. However, if the SiC film 12 is relatively thin (e.g., less than or equal to 100 nanometers thick), the roughness of the reaction surface of the Si substrate 11 will have negative effect on the SiC film 12. In other words, the roughness of the reaction surface of the Si substrate 11 adds an uneven stress to the SiC film 12. It causes cracks entering into SiC film 12 and peeling off of SiC film 12 from Si substrate 11 during the Si etching.

Therefore, according to the present embodiment, during the wet etching of Si substrate 11, by moving Si substrate 11 and SiC film 12 relatively to liquid chemical of wet etching, liquid chemical after reacting and bubbles are prevented from staying locally on the reaction surface of Si substrate 11, so that roughening of the reaction surface of Si substrate 11 can be suppressed. As a result, uneven stress can be prevented from being added to SiC film 12, and film thinning of SiC film 12 can be achieved.

In particular, as a method of wet etching of Si, when the method of removing Si by spin etching (the first method shown in FIG. 12) is adopted, the SiC film 12 is exposed to liquid chemical during the wet etching only while the reverse side 12b of the SiC film 12 is exposed at the bottom of the recessed part 13. Also, the top surface 12a of SiC film 12 is not exposed to liquid chemical during wet etching. For this reason, the damage of SiC film 12 by liquid chemical can be minimized.

Also, by using mixed acid as liquid chemical for wet etching of Si, the damage of SiC film 12 by liquid chemical can be suppressed. As a result, the production yield ratio of SiC film 12 can be improved, and SiC films can be formed in a large area.

Figure 17:
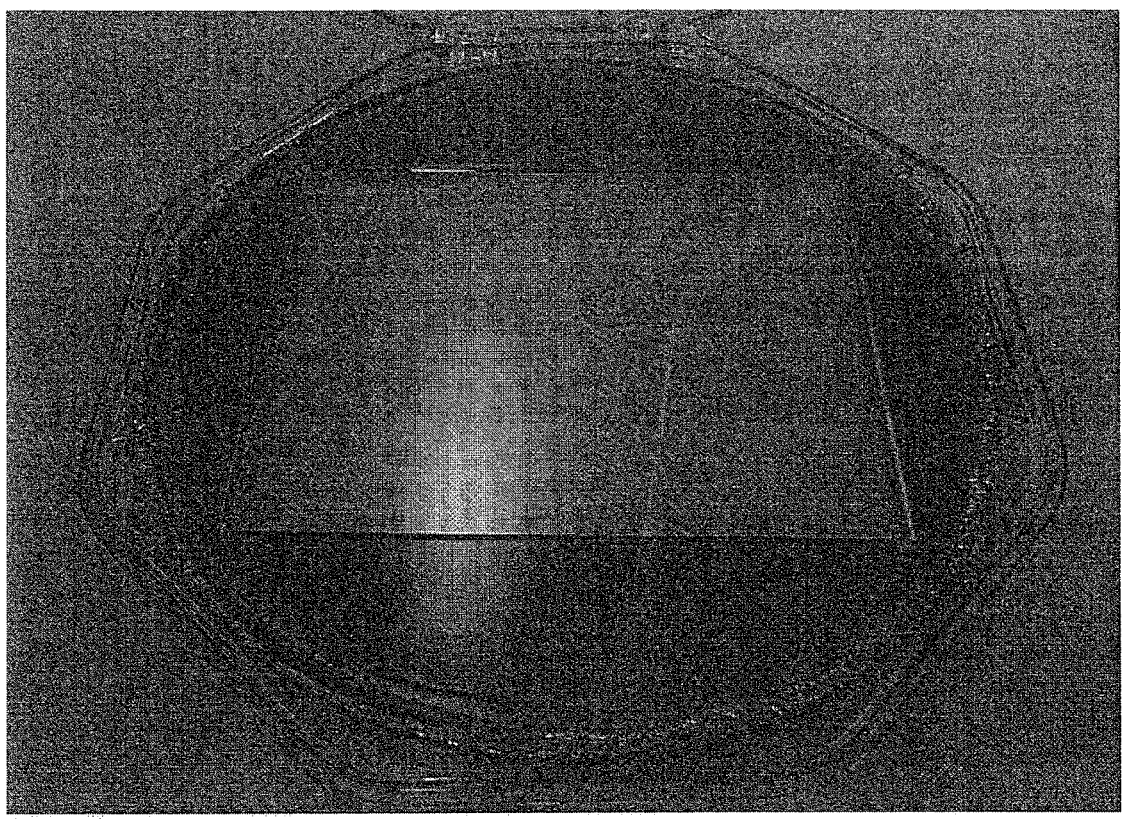
FIG. 17 is a photograph of a pellicle manufactured using a method for manufacturing of the first embodiment of the present invention.

FIG. 17 is a photograph of a pellicle manufactured using the method for manufacturing of the first embodiment of the present invention.

Referring to FIG. 17, this pellicle has a supporting member consisting of a Si substrate with a diameter of 200 millimeters and a pellicle film. The pellicle film is composed of a SiC film having a thickness of 30 nanometers formed on the supporting member and measuring 11 cm×14 cm.

Second Embodiment

Figure 18:
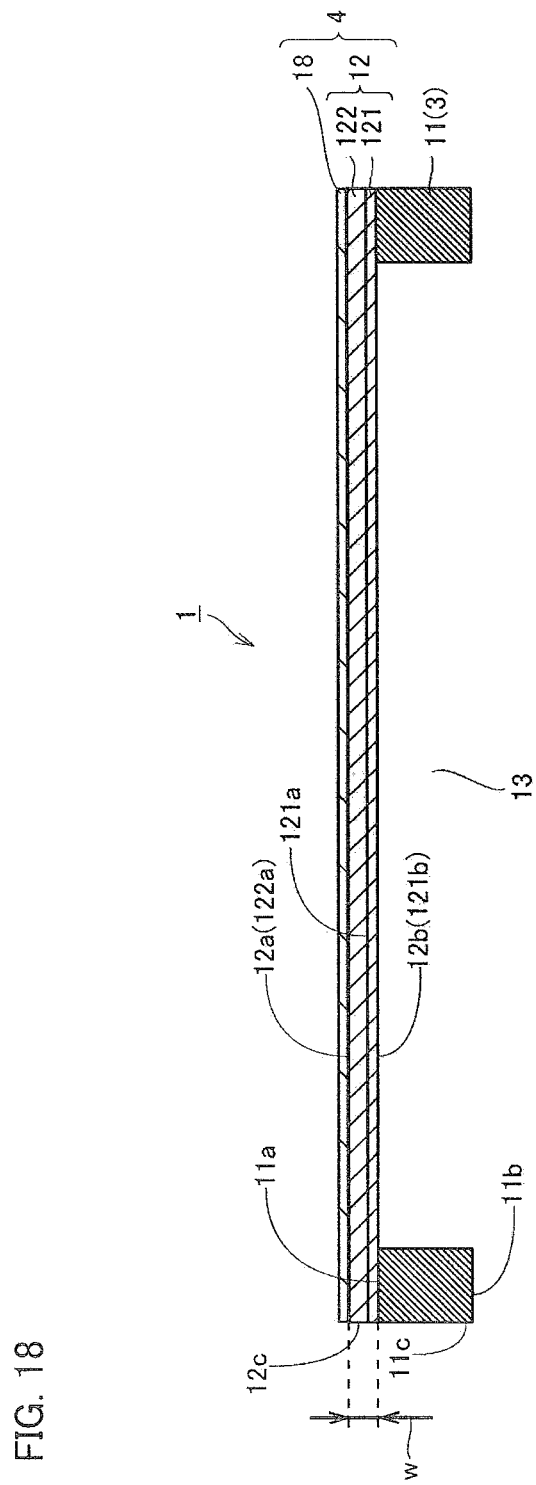
FIG. 18 is a cross-sectional view showing the configuration of pellicle 1 in the second embodiment of the present invention.

FIG. 18 is a cross-sectional view showing the configuration of pellicle 1 in the second embodiment of the present invention. FIG. 18 shows the cross-sectional view when the SiC film 12 is cut on a plane perpendicular to the top surface 12a.

Referring to FIG. 18, pellicle 1 in the present embodiment is different from pellicle 1 in the first embodiment, in that pellicle film 4 further includes a radiation film 18. The radiation film 18 is formed on top surface 12a of SiC film 12 (top surface 122a of SiC film 122). The radiation film 18 has the same planar shape as the SiC film 12. The radiation film 18 has a higher radiation factor than that of SiC films 121 and 122. The radiation film 18 contains, for example, Ru (ruthenium), and is preferably made of Ru.

After forming SiC film 122, the radiation film 18 is formed onto top surface 122a of SiC film 122 using the sputtering method, the ALD (Atomic Layer Deposition) method, or the like. Before exposing reverse side 12b of SiC film 12 by wet etching, the radiation film 18 may be formed. After exposing reverse side 12b of SiC film 12 by wet etching, the radiation film 18 may be formed. In order to reinforce SiC film 12 during wet etching with radiation film 18, the radiation film 18 is preferably formed before exposing reverse side 12b of SiC film 12 by wet etching.

The configuration of pellicle 1 and the method for manufacturing other than those described above are the same as the configuration of the pellicle and the method for manufacturing in the first embodiment. Therefore, the same members are given the same reference numerals, the description will not be repeated.

When SiC film 12 is thinned, the heat conductivity of the SiC film 12 in the direction parallel to the top surface 12a (the horizontal direction in FIG. 18) decreases. For this reason, when using pellicle 1, the temperature rise of SiC film 12 due to the energy of the exposure light becomes remarkable. According to the present embodiment, since the heat accumulated in SiC film 12 is radiated outside through the radiation film 18, the temperature rise of SiC film 12 can be suppressed.

Third Embodiment

Figure 19:
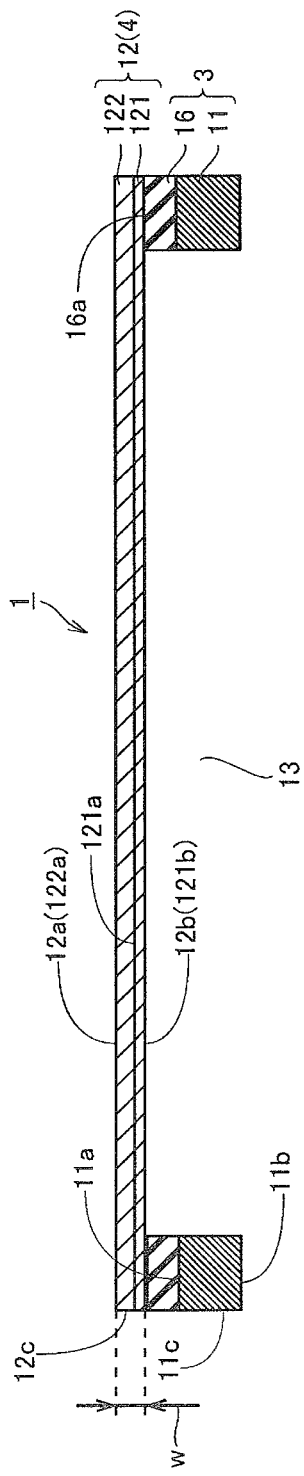
FIG. 19 is a cross-sectional view showing the configuration of pellicle 1 in the third embodiment of the present invention.

FIG. 19 is a cross-sectional view showing the configuration of pellicle 1 in the third embodiment of the present invention. FIG. 19 shows the cross-sectional view when the SiC film 12 is cut on a plane perpendicular to the top surface 12a.

Referring to FIG. 19, pellicle 1 in the present embodiment is different from pellicle 1 of the first embodiment in that supporting member 3 includes Si substrate 11 and Si oxide film 16. Si oxide film 16 is formed on top surface 11a of Si substrate 11, and has the same planar shape as Si substrate 11. The SiC film 12 is formed on the top surface 16a of the Si oxide film 16 (on the top surface 11a side of the Si substrate 11). Supporting member 3 is composed of Si substrate 11 and Si oxide film 16.

Si oxide film 16 is made of PSG (Phosphorus Silicate Glass), BPSG (Boron Phosphorus Silicate Glass), $SiO_2$, or the like, and has a thickness of, for example, 100 nanometers or more and 2000 nanometers or less.

In addition, between Si oxide film 16 and SiC film 12, a Si film (not shown) may be formed.

Next, the method for manufacturing of pellicle 1 in the present embodiment will be described using FIGS. 20 to 24.

Figure 20:
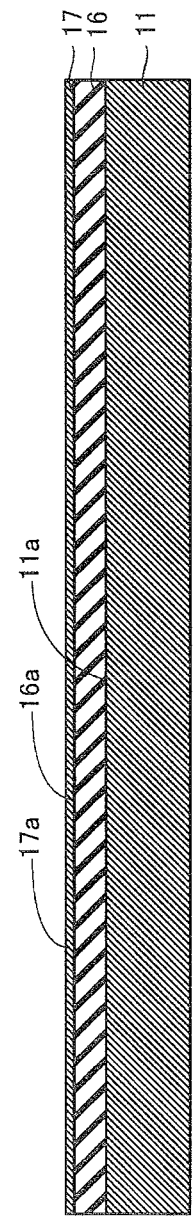
FIG. 20 is a cross-sectional view indicating the first step of the method for manufacturing of pellicle 1 in the third embodiment of the present invention.

Referring to FIG. 20, for example, a SOT (Silicon on Insulator) substrate of disc-shaped (recessed part 13 is not formed) is prepared. The SOI substrate includes Si substrate 11, Si oxide film 16, and Si film 17. Si oxide film 16 is made of $SiO_2$ formed on top surface 11a of Si substrate 11. The Si film 17 is formed on top surface 16a of Si oxide film 16. Although the thickness of the Si film 17 is not limited, the Si film 17 preferably has a thickness of 4 nanometers or more and 10 nanometers or less so that good SiC film 121 is formed without leaving the Si film 17 at the later carbonizing step.

The Si film 17 may be thinned so that the thickness of the Si film 17 is in the above range. Film thinning of the Si film 17 may be performed as follows. For example, by heating the SOI substrate in an oxidizing atmosphere, surface 17a of Si film 17 is oxidized. Subsequently, the oxide formed on the surface 17a of the Si film 17 is removed by wet etching.

Further, instead of using a SOI substrate, the structure of FIG. 20 may be created by the following method. Si oxide film 16 is formed on top surface 11a of Si substrate 11. Si film 17 is formed on the top surface 16a of the Si oxide film 16.

Figure 21:
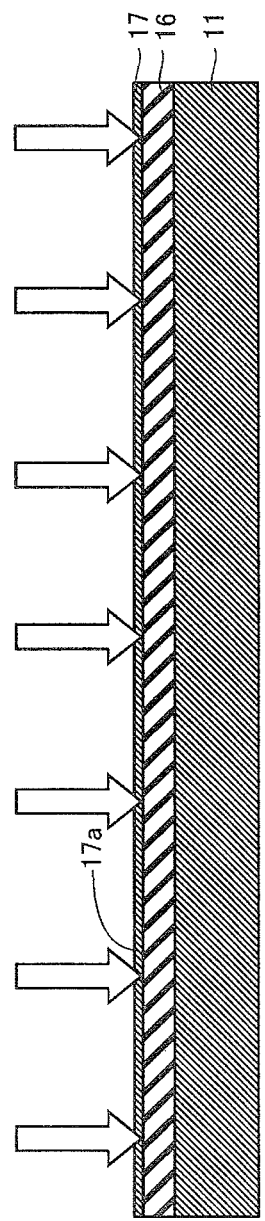
FIG. 21 is a cross-sectional view indicating the second step of the method for manufacturing of pellicle 1 in the third embodiment of the present invention.

Referring to FIG. 21, if necessary, P (phosphorus), B (boron) or P ions may be introduced through surface 17a of Si film 17 to Si oxide film 16. Thus, the composition of Si oxide film 16 changes from $SiO_2$ without B or P to PSG or BPSG. In addition, the introduction of the above ions may be omitted, so that Si oxide film 16 may be formed of $SiO_2$ containing no B or P.

When Si oxide film 16 made of PSG is formed, the following is preferable. The introduction amount of P ions is $1*10^{15}/cm^2$ or more and $5*10^{18}/cm^2$ or less. The doping amount of P atoms in Si oxide film 16 is 5 atomic % or more and 7 atomic % or less. Thus, Si oxide film 16 can be sufficiently softened while suppressing an increase in the hygroscopicity of Si oxide film 16. Further, it is preferable that the substrate temperature at the time of introduction of P ions is 200 degrees Celsius or more and 550 degrees Celsius or less. Thus, the crystal property of the Si film 17 can be prevented from lowering. Further, the acceleration energy of P ions is preferably 5 keV or more and 30 keV or less. Thus, it is possible to maintain the crystal properties and an appropriate film thickness of the SiC film 12 formed later.

Figure 22:
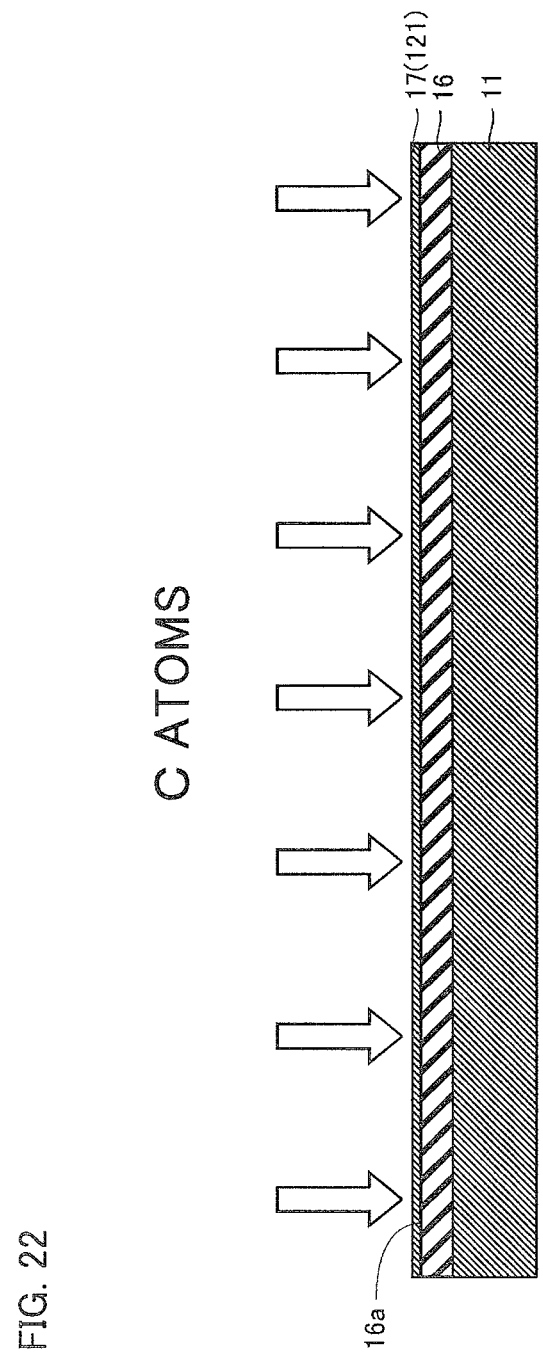
FIG. 22 is a cross-sectional view indicating the third step of the method for manufacturing of pellicle 1 in the third embodiment of the present invention.

Referring to FIG. 22, next, the Si film 17 is carbonized by heating the Si film 17 in a hydrocarbon-based gas atmosphere. As a result, the Si film 17 changes to SiC film 121. The temperature in the atmosphere is preferably 900 degrees Celsius to 1405 degrees Celsius. The hydrocarbon-based gas is propane gas, and it is preferable to use hydrogen gas as a carrier gas. The flow rate of propane gas is, for example, 10 sccm, and the flow rate of hydrogen gas is, for example, 1000 sccm.

When the substrate is cooled after carbonizing of Si film 17, tensile stress occurs in SiC film 121 due to the difference in shrinkage rate between SiC film 121 and Si substrate 11. However, by interposing Si oxide film 16 which is a relatively soft material, the tensile stress inside SiC film 121 can be reduced.

Note that the Si film 17 may not be completely carbonized, and a part of the Si film 17 may be left near the boundary face with Si oxide film 16. In this case, by the Si film 17 interposed between Si oxide film 16 and SiC film 121, the flatness of the boundary face between Si oxide film 16 and SiC film 121 can be improved. Regardless of whether the Si film 17 was completely carbonized or not, the SiC film 121 is formed on the top surface 16a side of the Si oxide film 16.

Figure 23:
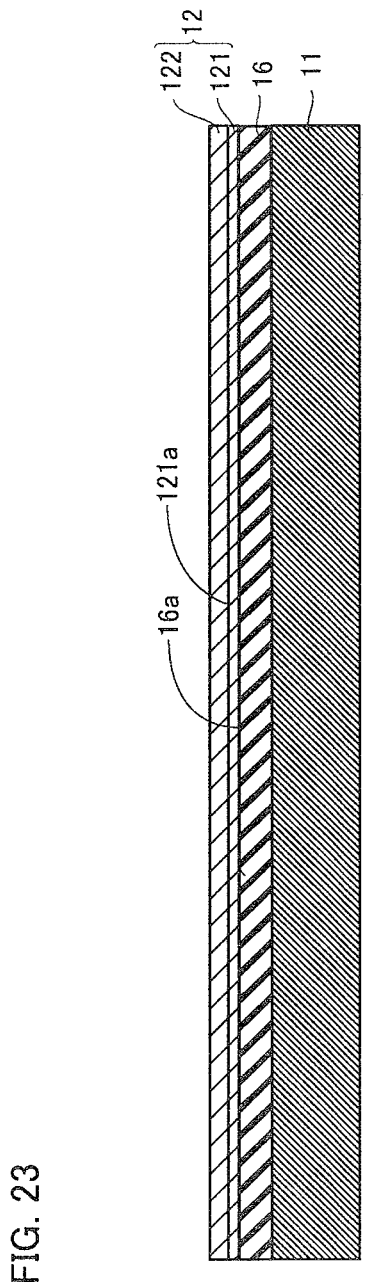
FIG. 23 is a cross-sectional view indicating the fourth step of the method for manufacturing of pellicle 1 in the third embodiment of the present invention.

Referring to FIG. 23, then, SiC film 122 is formed by epitaxial growth on surface 121a of SiC film 121. Thus, SiC film 12 consisting of SiC films 121 and 122 is obtained on top surface 16a of Si oxide film 16.

The epitaxial growth of SiC film 122 is performed, for example, as follows. While source gas consisting of methyl silane-based gas is supplied at a flow rate of about 1.0 sccm, the substrate on which the SiC film 121 is formed is heated to a temperature of 900 degrees Celsius or more and 1405 degrees Celsius or less.

When the substrate is cooled after epitaxial growth of SiC film 122, tensile stress due to the difference in shrinkage rate between SiC film 12 and Si substrate 11 occurs within SiC film 12. However, by interposing Si oxide film 16 which is a relatively soft material, the tension stress in SiC film 12 can be mitigated.

Figure 24:
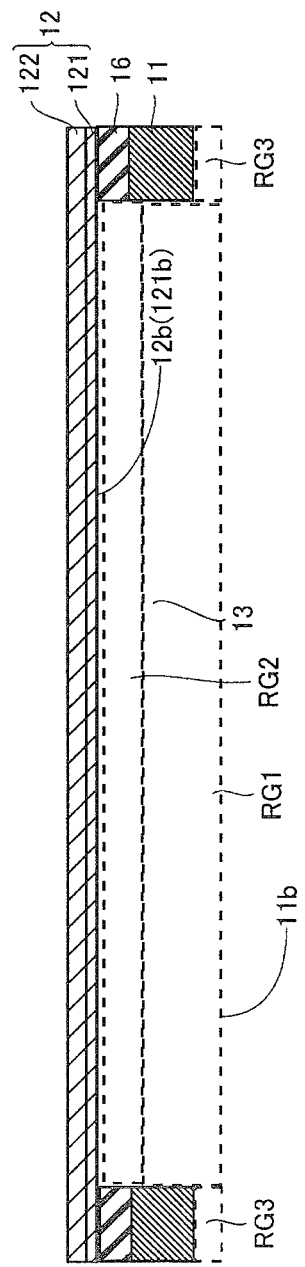
FIG. 24 is a cross-sectional view indicating the fifth step of the method for manufacturing of pellicle 1 in the third embodiment of the present invention.

Referring to FIG. 24, subsequently, as the same manner as the first embodiment, Si of central part RG1 of reverse side 11b of Si substrate 11 is removed to form recessed part 13. When the formation of recessed part 13, Si of central part RG1 may be completely removed and recessed part 13 may be formed to a depth reaching Si oxide film 16. This provides intermediary body 2.

Afterwards, as the same manner as the first embodiment, Si substrate 11 and Si oxide film 16 on the bottom surface RG2 of recessed part 13 and peripheral part RG3 of reverse side 11b of Si substrate 11 are removed by wet etching (if Si substrate 11 of bottom surface RG2 of recessed part 13 was completely removed when the formation of recessed part 13, Si oxide film 16 of bottom surface RG2 of recessed part 13 is removed). Thus, reverse side 12b of SiC film 12 is exposed. Liquid chemical (such as mixed acid) generally used for wet etching of Si has a property of dissolving a Si oxide film. For this reason, Si oxide film 16 can be removed by the same method as in the wet etching of Si in the first embodiment. With the above steps, pellicle 1 shown in FIG. 19 is obtained.

The configuration of pellicle 1 and the method for manufacturing other than those described above are the same as the configuration of the pellicle and the method for manufacturing in the first embodiment. Therefore, the same members are given the same reference numerals, and the description will not be repeated.

According to the present embodiment, the same effects as in the first embodiment can be obtained. In addition, by interposing Si oxide film 16 between Si substrate 11 and SiC film 12, tension stress in SiC film 12 can be mitigated. As a result, breakage of the SiC film 12 during manufacturing can be suppressed, and the manufacturing yield of the SiC film 12 can be improved.

As a modification of the method for manufacturing in this embodiment, as like the modification shown in FIG. 16 of the first embodiment, after the Si of central part RG1 of reverse side 11b of Si substrate 11 was removed to form recessed part 13, SiC film 12 may be formed on top surface 16a of Si oxide film 16. After that, reverse side 12b of SiC film 12 may be exposed by wet etching to produce pellicle 1.

Fourth Embodiment

Figure 25:
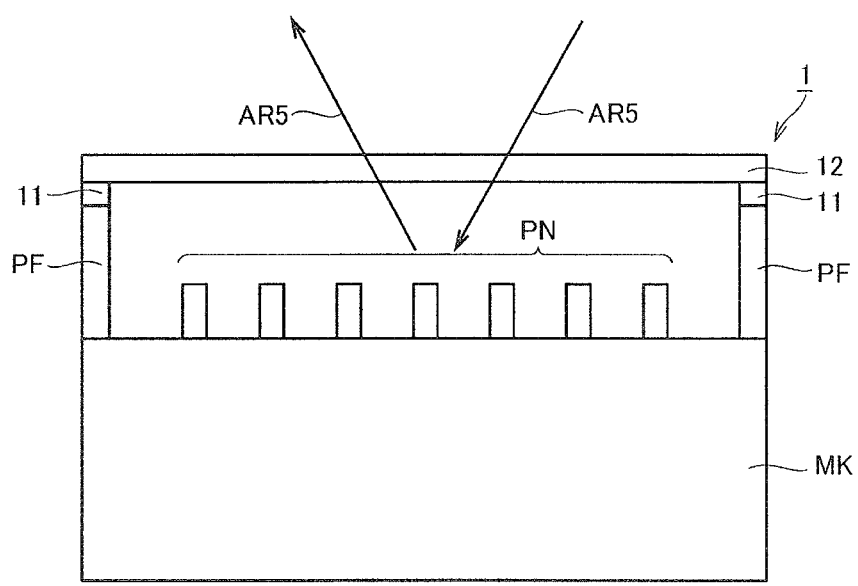
FIG. 25 is a cross-sectional view showing an example of use of pellicle 1 in the fourth embodiment of the present invention.

FIG. 25 is a cross-sectional view showing an example of how to use pellicle 1 according to the fourth embodiment of the present invention.

Referring to FIG. 25, according to the present embodiment, pellicle 1 in the first to third embodiments is used as a pellicle covering mask MK. On the surface of mask MK, patterns PN for blocking exposure light and pellicle frame PF for supporting pellicle 1 are provided. The pellicle 1 is fixed to pellicle frame PF by bonding or the like, with Si substrate 11 as the mask MK side and SiC film 12 (or radiation film 18 when the pellicle film includes radiation film 18) as the opposite side of the mask MK side. Pellicle 1 may be processed according to the shape of mask MK or pellicle frame PF as needed.

Pellicle 1 is for preventing exposure troubles which are caused by foreign matters adhering to the mask MK at the time of exposure and being focused on the object to be exposed (a semiconductor substrate, etc.). As shown by arrow AR5, the exposure light passes through pellicle 1 and enters the surface of mask MK. Portions of the exposure light that has passed through the gaps between the patterns PN are reflected by the surface of the mask MK and transmits through the pellicle 1. Afterwards, the exposure light irradiates photoresist (not shown) applied to the surface of the exposure object.

Any wavelength light can be used as the exposure light. It is preferable to use EUV light having wavelength of several tens of nanometers to a few nanometers as exposure light, to realize high resolution lithography technology. SiC is chemically more stable than Si and has high transmittance and high light resistance to EUV light. SiC is suitable as a pellicle when EUV light is used as exposure light. In particular, like pellicle 1 in the first to third embodiments, by using the pellicle 1 which includes very thin SiC film 12 of which the thickness is 20 nanometers or more and 100 nanometers or less, higher transmittance can be achieved.

In addition, instead of the fixing methods described above, pellicle 1 may be fixed to pellicle frame PF by bonding or the like, with SiC film 12 as the mask MK side (if pellicle film 4 includes radiation film 18, radiation film 18 is placed at the mask MK side) and Si substrate 11 as the opposite side to the mask MK side.

Others

In the above-described embodiments, the case where Si on the bottom surface of recessed part 13 is removed by wet etching has been described. According to the present invention, the portion removed by wet etching may be at least a part of the other principal surface of Si substrate. The position, size, and shape of the part to be removed are arbitrary.

The embodiments described above can be combined with one another. For example, by combining the second embodiment and the third embodiment, SiC film 12 may be formed on top surface 16a of Si oxide film 16, and the radiation film 18 may be formed on the top surface 12a of the SiC film 12.

The embodiments described above are to be considered in all respects as illustrative and not restrictive. The scope of the present invention is defined by the terms of the claims, not the description above, and is intended to include any modifications within the scope and meanings equivalent to the terms of the claims.

DESCRIPTION OF REFERENCE NUMBERS

1: pellicle
2: intermediary body
3: supporting member
4: pellicle film
11: Si (silicon) substrate
11a: top surface of Si substrate
11b: reverse side of Si substrate
11c: side surface of Si substrate
12, 121, 122: SiC (silicon carbide) film
12a, 121a, 122a: top surface of SiC film.
12b, 121b: reverse side of SiC film.
12c: side surface of SiC film.
13: recessed part
14: mask layer
15: photoresist
16: Si oxide film
16a: top surface of Si oxide film
17: Si film
17a: top surface of Si film
18: radiation film
CS: reaction vessel
HP: holding platform
MA: liquid chemical
MK: mask
PF: pellicle frame
PL: plane parallel to surface of SiC film
PN: pattern
RG1: central part of reverse side of Si substrate
RG2: bottom surface of recessed part of Si substrate
RG3: peripheral part of reverse side of Si substrate

What is claimed is:
1. A pellicle comprising:
a supporting member with a ring-like and planar shape and containing Si, and
a pellicle film formed on one principal surface of the supporting member, wherein the pellicle film includes a SiC film having a thickness of 10 nanometers or more and 100 nanometers or less, and the SiC film includes
  a first SiC film formed on the one principal surface of the supporting member and having a first average carbon concentration, and
  a second SiC film formed on one principal surface of the first SiC film and having a second average carbon concentration different from the first average carbon concentration.

2. The pellicle according to claim 1, wherein
a SiC film is not formed on another principal surface of the supporting member.

3. The pellicle according to claim 1, wherein
a Si oxide film is not formed on a principal surface opposite to a side on which the supporting member is formed on the SiC film.

4. The pellicle according to claim 1, wherein
the pellicle film further includes a radiation film formed on one principal surface of the second SiC film, and the radiation film has a higher radiation factor than radiation factors of the first and second SiC film.

5. The pellicle according to claim 4, wherein
the radiation film contains Ru.

6. The pellicle according to claim 1, wherein
a thickness of the first SiC film is greater than 0 and less than or equal to 10 nanometers and
the first average carbon concentration is lower than the second average carbon concentration.

7. The pellicle according to claim 1, wherein
a transmittance rate of the pellicle film for light having wavelength of 13.5 nanometers is 70% or more.

8. The pellicle according to claim 1, wherein
the supporting member is composed of a Si substrate.

9. The pellicle according to claim 1, wherein
the supporting member includes a Si substrate and a Si oxide film formed on one principal surface of the Si substrate.

10. A method for manufacturing a pellicle comprising:
a step to prepare a supporting member containing Si, and
a step to form a pellicle film on one principal surface of the supporting member, wherein
the step to form the pellicle film includes
  a step to form a first SiC film having a first average carbon concentration on one principal surface of the supporting member, by carbonizing Si of the one principal surface of the supporting member, and
  a step to form a second SiC film having a second average carbon concentration different from the first average carbon concentration on one principal surface of the first SiC film, wherein the method further comprises
a step to exposes at least a part of another principal surface of the first SiC film by wet etching.

11. The method for manufacturing a pellicle according to claim 10, wherein
the step to form the pellicle film includes a step to form a radiation film having a radiation factor higher than radiation factors of the first and second SiC films on one principal surface of the second SiC film.

12. The method for manufacturing a pellicle according to claim 11, wherein
the step to expose at least a part of another principal surface of the first SiC film is performed after the step to form the radiation film.

13. The method for manufacturing a pellicle according to claim 10, wherein
at least the supporting member and the first SiC film are moved relative to liquid chemical used for the wet etching, in the step to expose at least a part of another principal surface of the first SiC film.

14. The method for manufacturing a pellicle according to claim 13, wherein
at least the supporting member and the first SiC film are moved in a direction in a plane parallel to the another principal surface of the first SiC film, in the step to expose at least a part of another principal surface of the first SiC film.

15. The method for manufacturing a pellicle according to claim 14, wherein
at least with the supporting member and the first SiC film rotated, liquid chemical used for the wet etching is injected onto another principal surface of the supporting member, in the step to expose at least a part of another principal surface of the first SiC film.

16. The method for manufacturing a pellicle according to claim 10, further comprising
a step to form a recessed part having Si as a bottom surface on a central part of another principal surface of the supporting member, wherein
the first SiC film is exposed on the bottom surface of the recessed part, in the step to expose at least a part of another principal surface of the first SiC film.

17. The method for manufacturing a pellicle according to claim 16, wherein
the central part of the another principal surface of the supporting member is removed by wet etching, with a mask layer consisting of an oxide film or a nitride film formed on the another principal surface of the supporting member as a mask, in the step to form a recessed part on the central part of the another principal surface of the supporting member.

18. The method for manufacturing a pellicle according to claim 10, wherein
mixed acid including hydrofluoric acid and nitric acid is used as liquid chemical used for the wet etching, in the step to expose at least a part of another principal surface of the first SiC film.

19. The method for manufacturing a pellicle according to claim 10, wherein
a Si substrate is prepared as the supporting member, in the step to prepare a supporting member.

20. The method for manufacturing a pellicle according to claim 10, wherein
a Si substrate, a Si oxide film formed on one principal surface of the Si substrate, and a Si film formed on one principal surface of the Si oxide film are prepared in the step to prepare the supporting member, and
at least a part of the Si film is carbonized, in the step to form the first SiC film.

* * * * *